United States Patent
Bhandari et al.

(10) Patent No.: US 12,356,732 B2
(45) Date of Patent: Jul. 8, 2025

(54) PHOTOVOLTAIC DEVICES WITH CONDUCTING LAYER INTERCONNECTS

(71) Applicant: First Solar, Inc., Tempe, AZ (US)

(72) Inventors: Nikhil Bhandari, Perrysbury, OH (US); Matthew Davis, East Rochester, NY (US); Rhett Miller, San Jose, CA (US); Charles Wickersham, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 18/282,146

(22) PCT Filed: Mar. 17, 2022

(86) PCT No.: PCT/US2022/020720
§ 371 (c)(1),
(2) Date: Sep. 14, 2023

(87) PCT Pub. No.: WO2022/197905
PCT Pub. Date: Sep. 22, 2022

(65) Prior Publication Data
US 2024/0154052 A1   May 9, 2024

Related U.S. Application Data

(60) Provisional application No. 63/278,371, filed on Nov. 11, 2021, provisional application No. 63/163,670, filed on Mar. 19, 2021.

(51) Int. Cl.
*H10F 19/90* (2025.01)
*H10F 71/00* (2025.01)

(52) U.S. Cl.
CPC ........... *H10F 19/904* (2025.01); *H10F 71/00* (2025.01)

(58) Field of Classification Search
CPC .............................. H10F 19/904; H10F 71/00
See application file for complete search history.

(56) References Cited

U.S. PATENT DOCUMENTS

| 9,457,429 B2 | 10/2016 | Borgeson et al. |
| 11,581,453 B2 | 2/2023 | Bhandari et al. |
| 2011/0226748 A1* | 9/2011 | Kawazoe ............ H01L 31/0463 219/121.72 |
| 2012/0204930 A1* | 8/2012 | Verdugo ............... H01L 31/202 257/E31.037 |
| 2012/0241941 A1 | 9/2012 | Kim et al. |
| 2023/0187572 A1 | 6/2023 | Bhandari et al. |
| 2024/0114334 A1 | 1/2024 | Bhandari et al. |

FOREIGN PATENT DOCUMENTS

| EP | 3764405 A1 | 1/2021 |
| FR | 3083369 A1 | 1/2020 |
| WO | WO-2019165041 A1 * | 8/2019 ........ H01L 31/02167 |

OTHER PUBLICATIONS

PCT International Search Report and Written Opinion, Application No. PCT/US2022/020720, dated Jun. 20, 2022.

* cited by examiner

*Primary Examiner* — Devina Pillay
(74) *Attorney, Agent, or Firm* — MacMillan, Sobanski & Todd, LLC

(57) ABSTRACT

According to the embodiments provided herein, an island in a regular, closed shape is ablated in a first conductive layer. An interconnect is formed through the island, using the island as an alignment fiducial. The island and the interconnect are isolated from the remainder of the first conductive layer.

8 Claims, 10 Drawing Sheets

PHOTOVOLTAIC DEVICES WITH CONDUCTING LAYER INTERCONNECTS

CROSS-REFERENCE TO RELATED APPLICATIONS

This is a national phase application of international application PCT/US2022/020720, filed on Mar. 17, 2022, and claims the benefit of U.S. Provisional Application No. 63/163,670, filed on Mar. 19, 2021, and U.S. Provisional Application No. 63/278,371, filed on Nov. 11, 2021, each of which is incorporated by reference in the entirety.

BACKGROUND

The present specification generally relates to photovoltaic devices with conducting layer interconnects and, more specifically, to photovoltaic cells having conducting layer interconnects for forming electrical connections between neighboring cells of photovoltaic devices.

A photovoltaic device generates electrical power by converting light into electricity using semiconductor materials that exhibit the photovoltaic effect. Photovoltaic devices include a number of layers divided into a plurality of photovoltaic cells by selective removal of certain regions of the layers. Each photovoltaic cell converts sunlight into electrical power and can be electrically connected with one or more neighboring cells. Such electrical connections can be formed by filling the removed regions with conductive materials. The dimensions of the removed regions and the conductive materials can impact the performance and manufacturability of the photovoltaic device.

Selective removal of certain regions of the layers can be performed using a laser ablation process, sometimes referred to as laser scribing. A need exists to improve the accuracy and repeatability of scribes placed over photovoltaic device substrates.

SUMMARY

According to some embodiments, a photovoltaic device is provided that has a semiconductor stack over a first contact, a conductive island formed in a first conductive layer over the semiconductor stack, and an interconnect formed through the conductive island, wherein the conductive island and the interconnect are isolated from the first conductive layer at the conductive island, and the interconnect forms an electrical connection with the first contact.

According to some embodiments, a conductive device is provided that has a plurality of layers on a substrate, including at least one conductive layer and at least one dielectric layer on the conductive layer, a regular closed shaped island on the dielectric layer, and a cylindrical shaped interconnect disposed laterally substantially within the island, and disposed substantially vertically through the island and the dielectric layer to the conductive layer. According to some embodiments, the circular shaped conductive island is cylindrical, the vertical length of the cylindrical conductive island being less than the vertical length of the cylindrical shaped interconnect.

According to some embodiments, a method for forming a conductive interconnection is provided. The method includes forming a semiconductor stack 176 (FIGS. 2 and 5) over a first contact. A first conductive layer 180 (M1) is formed over the semiconductor stack 176. A shaped region of the first conductive layer 180 (M1) is ablated from the semiconductor stack 176, wherein a conductive island 240 (FIG. 6) is formed from the first conductive layer 180 (M1) and demarcated by the shaped region (for example, the shape produced by the annular scribe ring 800, 900 of FIGS. 10 and 11, respectively). A dielectric layer 210 (FIG. 7) is formed over the first conductive layer 180 (M1), wherein the dielectric layer at least partially fills the shaped region. A passage (P2.1 scribe 234, FIG. 8) is formed through the circular conductive island 240 of the first conducting layer 180 (M1), leaving behind the remaining portion of conductive island 242 (FIG. 8). The passage extends through the dielectric layer 210, the remaining portion of conductive island 242, and the semiconductor stack 176. The passage is at least partially filled with an interconnect that forms an electrical connection with the first contact (TCO layer 140).

According to the embodiments provided herein, a photovoltaic device includes a semiconductor stack formed over a first electrical contact. A first conductive layer is formed over the semiconductor stack. A conductive island is formed in the first conductive layer over the semiconductor stack. An interconnect is formed through the conductive island, where the conductive island and the interconnect are isolated from the first conductive layer at the conductive island. The interconnect forms an electrical connection with the first contact. According to some embodiments, the conductive island is produced using an annular scribe.

According to a further set of embodiments, a portion of the conductive island is ablated, leaving behind a remaining portion of the island. An interconnect is formed through the remaining portion of the island, where the remaining portion of the island and the interconnect are isolated from the first conductive layer at the remaining portion of the island. The interconnect forms an electrical connection with the first contact.

According to some embodiments, a method for forming a photovoltaic device is provided. A layered device is provided comprising a transparent layer, a transparent conductive oxide layer, a semiconductor stack, and a first conducting layer. A P2.0 laser ablation is performed on the first conducting layer down to the semiconductor stack to produce a P2.0 scribe using an annular scribe ring to define a conductive island in the first conducting layer. A dielectric layer is added to the layered device by at least partially filling the P2.0 scribe with dielectric material. A P2.1 laser ablation is performed on the dielectric layer, the island, and the semiconductor stack to produce a P2.1 scribe within the P2.0 scribe. According to some embodiments, a device is provided that has a substrate having at least one conductive layer and at least one dielectric layer disposed thereon, one of the conductive and dielectric layers being over the substrate to form an intermediate layer, and the other one of the conductive and dielectric layers being over the intermediate layer to form an upper layer, and an alignment fiducial island on the upper layer, the alignment fiducial having a regular closed shape. In some embodiments, the island has a shape selected from the group consisting of circles, ovals, rectangles, squares, and polygons.

The embodiments presented herein relate to photovoltaic devices with conducting layer interconnects. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments for producing conducting layer interconnects for photovoltaic devices using an alignment process are presented herein. Photovoltaic devices include a number of layers divided into a plurality of photovoltaic cells by selective removal of certain regions of the layers. Each photovoltaic cell converts sunlight into electrical power and can be electrically connected with one or more neighboring cells. Such electrical connections can be formed by filling the removed regions with conductive materials. The dimensions of the removed regions directly control the dimensions of the conductive materials. As such, the dimensions of the removed regions can impact the performance and manufacturability of the photovoltaic device. Selective removal of certain regions of the layers can be performed using a laser ablation process, sometimes referred to as laser scribing.

Figure 1:
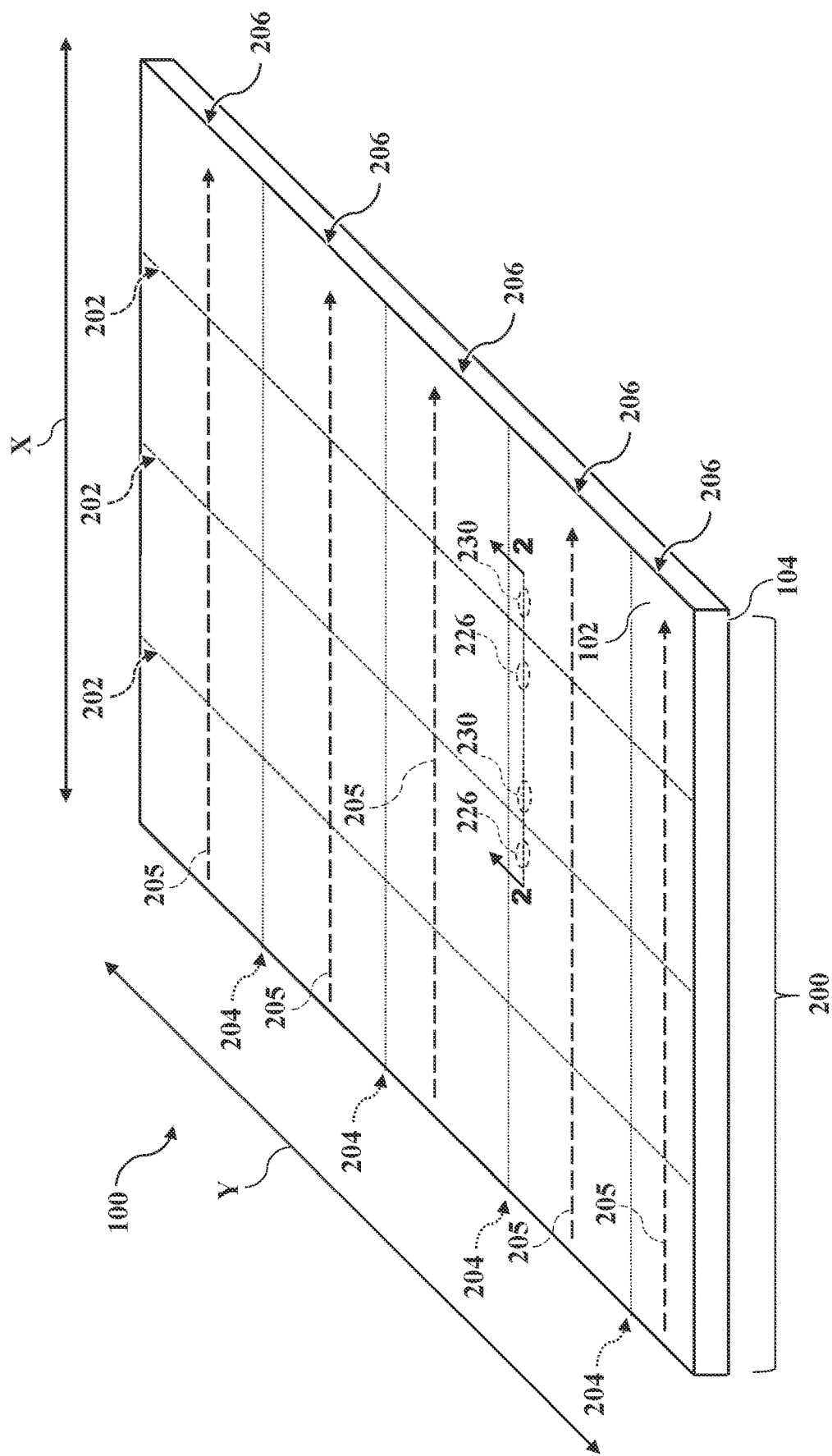
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define a first side 102 configured to be exposed to a light source such as, for example, the sun. The photovoltaic device 100 can also define an opposing side 104 offset from the first side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the first side 102 and the opposing side 104. As used herein, the term "layer" refers to a thickness of material provided upon a surface. Each layer can cover all or any portion of the surface. In some embodiments, the layers of the photovoltaic device 100 can be divided into an array of photovoltaic cells 200. For example, photovoltaic device 100 can be scribed according to a plurality of serial scribes 202 and a plurality of parallel scribes 204. The serial scribes 202 can extend along a length Y of photovoltaic device 100 and demarcate photovoltaic cells 200 along length Y of photovoltaic device 100.

The serial scribes 202 can be configured to connect neighboring cells of the photovoltaic cells 200 serially along a width X of photovoltaic device 100. Serial scribes 202 can form a monolithic interconnect of the neighboring cells, i.e., on either side of a serial scribe 202. Under operations, current 205 can predominantly flow along the width X through the photovoltaic cells 200 serially connected by serial scribes 202. Under operations, parallel scribes 204 can limit the ability of current 205 to flow along length Y of photovoltaic device 100. Parallel scribes 204 are optional and can be configured to separate the photovoltaic cells 200 that are connected serially into groups 206 arranged along length Y. Accordingly, the serial scribes 202 and the parallel scribes 204 can demarcate the array of the photovoltaic cells 200.

Referring still to FIG. 1, the parallel scribes 204 can electrically isolate the groups 206 of photovoltaic cells 200 that are connected serially. In some embodiments, serially-connected groups 206 of the photovoltaic cells 200 can be connected in parallel to one another, such as, for example, via electrical bussing. Optionally, the number of parallel scribes 204 can be configured to limit a maximum current generated by each group 206 of photovoltaic cells 200. In some embodiments, the maximum current generated by each group 206 can be less than or equal to about 200 milliamps (mA).

Figure 2:
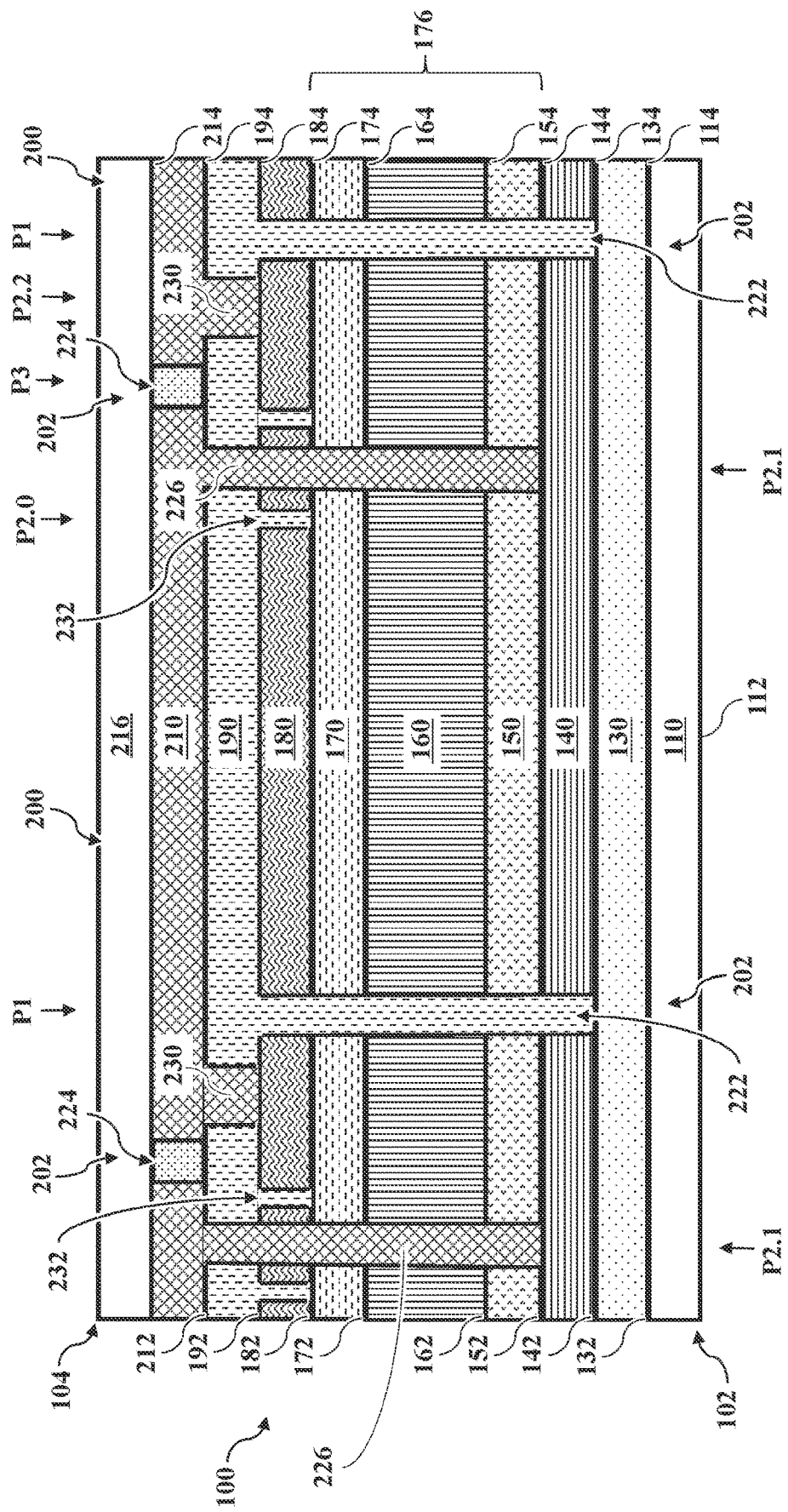
FIG. 2 schematically depicts a cross-sectional view along 2-2 of the photovoltaic device of FIG. 1 according to one or more embodiments shown and described herein.

Referring to FIG. 2, the layers of the photovoltaic device 100 can include a substrate 110 configured to facilitate the transmission of light into the photovoltaic device 100. The substrate 110 can be disposed at the first side 102 of the photovoltaic device 100. Substrate 110 can have a first surface 112 substantially facing the first side 102 of the photovoltaic device 100 and a second surface 114 substantially facing the opposing side 104 of the photovoltaic device 100. One or more layers of material can be disposed between the first surface 112 and the second surface 114 of the substrate 110.

Figure 3:
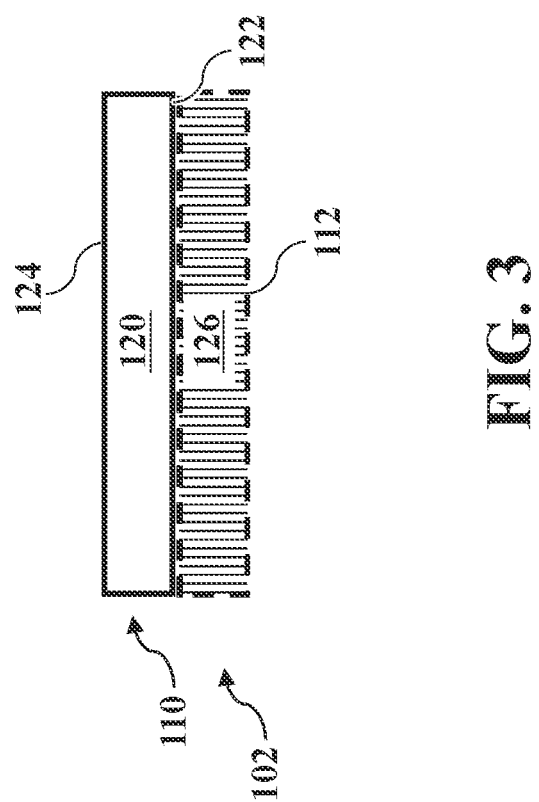
FIG. 3 schematically depicts a substrate according to one or more embodiments shown and described herein.

Referring to FIG. 3, substrate 110 can include a transparent layer 120 having a first surface 122 substantially facing the first side 102 of photovoltaic device 100 and a second surface 124 substantially facing the opposing side 104 of photovoltaic device 100. In some embodiments, the second surface 124 of transparent layer 120 can form the second surface 114 of substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments, or about 250 nm to about 950 nm in other embodiments. The transparent layer 120 may also have any suitable transmission percentage, including, for example, between about 50% and 90% transmittance, or higher. Optionally, the substrate 110 can include a coating 126 applied to the first surface 122 of the transparent layer 120. The coating 126 can be configured to interact with light or to improve durability of the substrate 110 such as, but not limited to, an antireflective coating, an anti-soiling coating, or a combination thereof.

Referring again to FIG. 2, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing first side 102 of photovoltaic device 100 and a second surface 134 substantially facing the opposing side 104 of photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers, and "over" means that the two layers have a fixed relationship to one another, which could include adjacent or having some intermediate layers.

Generally, the barrier layer 130 can be substantially transparent, thermally stable, with a reduced number of pin holes, high sodium-blocking capability, and/or good adhesive properties. Alternatively or additionally, barrier layer 130 can be configured to apply color suppression to light. Barrier layer 130 can include one or more layers of suitable material, including, but not limited to, tin oxide, silicon dioxide, aluminum-doped silicon oxide, silicon oxide, silicon nitride, or aluminum oxide. Barrier layer 130 can have any suitable thickness bounded by the first surface 132 and the second surface 134, including, for example, more than about 100 Å in one embodiment, more than about 150 Å in another embodiment, or less than about 200 Å in a further embodiment.

Referring still to FIG. 2, the photovoltaic device 100 can include a transparent conductive oxide (TCO) layer 140 configured to provide electrical contact to transport charge carriers generated by an absorber layer of the photovoltaic device 100. The TCO layer 140 can have a first surface 142 substantially facing first side 102 of photovoltaic device 100, and a second surface 144 substantially facing opposing side 104 of photovoltaic device 100. In some embodiments, TCO layer 140 can be provided adjacent to barrier layer 130. For example, first surface 142 of TCO layer 140 can be provided upon second surface 134 of barrier layer 130. Generally, TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, doped or undoped zinc oxide or cadmium stannate.

Photovoltaic device 100 can include a buffer layer 150 configured to provide an insulating layer between TCO layer 140 and any adjacent semiconductor layers. Buffer layer 150 can have a first surface 152 substantially facing first side 102 of the photovoltaic device 100, and a second surface 154 substantially facing opposing side 104 of photovoltaic device 100. In some embodiments, buffer layer 150 can be provided adjacent to TCO layer 140. For example, first surface 152 of buffer layer 150 can be provided upon second surface 144 of TCO layer 140. Buffer layer 140 may include material having higher resistivity than the TCO later 140, including, but not limited to, intrinsic tin dioxide, zinc magnesium oxide (e.g., $Zn_{1-x}Mg_xO$), tin dioxide ($SnO_2$), aluminum oxide ($Al_2O_3$), aluminum nitride (AlN), zinc tin oxide, zinc oxide, tin silicon oxide, or any combination thereof. In some embodiments, the material of buffer layer 140 can be configured to substantially match the band gap of an adjacent semiconductor layer (e.g., an absorber). Buffer layer 150 may have any suitable thickness between first surface 152 and second surface 154, including, for example, more than about 100 Å in one embodiment, between about 100 Å and about 800 Å in another embodiment, or between about 150 Å and about 600 Å in a further embodiment.

Referring still to FIG. 2, the photovoltaic device 100 can include an absorber layer 160 configured to cooperate with another layer and form a p-n junction within the photovoltaic device 100. Accordingly, absorbed photons of the light can free electron-hole pairs in absorber 160 and generate carrier flow, which can yield electrical power. Absorber layer 160 can have a first surface 162 substantially facing first side 102 of photovoltaic device 100, and a second surface 164 substantially facing opposing side 104 of photovoltaic device 100. A thickness of absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment.

According to the embodiments described herein, absorber layer 160 can be formed from a p-type semiconductor material having an excess of positive charge carriers, i.e., holes or acceptors. Absorber layer 160 can include one or more layers of any suitable p-type semiconductor material such as group II-VI semiconductors. Specific examples include, but are not limited to, semiconductor materials comprising cadmium, tellurium, selenium, or any combination thereof. Suitable examples include, but are not limited to, binaries of cadmium and tellurium, ternaries of cadmium, selenium and tellurium (e.g., $CdSe_xTe_{1-x}$), ternaries of cadmium, zinc, and tellurium (e.g., $CdZn_xTe_{1-x}$), a compound comprising cadmium, selenium, tellurium, and one or more additional element, or a compound comprising cadmium, zinc, tellurium, and one or more additional element. Alternatively, absorber 160 may include lead halide and other metal halide perovskite compounds $ABX_3$, where A and B are cations and X is a halogen anion. In examples, the A site may be occupied by one or more organic or inorganic cations, and the B site may be occupied by one or more metals, such as lead (Pb) or tin (Sb).

In embodiments where the absorber layer 160 comprises tellurium and cadmium, the atomic percent of the tellurium can be greater than or equal to about 25 atomic percent and less than or equal to about 50 atomic percent. In embodiments where absorber layer 160 comprises selenium and tellurium, the atomic percent of the selenium in the absorber layer 160 can be greater than about 0 atomic percent and less or equal to than about 25 atomic percent. In the above examples, the respective concentrations of tellurium, cadmium, and selenium can vary through the thickness of absorber layer 160. For example, when the absorber layer 160 comprises a compound including selenium at a mole fraction of x and tellurium at a mole fraction of 1–x ($Se_xTe_{1-x}$), x can vary in the absorber layer 160 with distance from first surface 162 of absorber layer 160.

Referring still to FIG. 2, absorber layer 160 can be doped with a dopant configured to manipulate the charge carrier concentration. In some embodiments, absorber layer 160 can be doped with a group I or V dopant such as, for example, copper, arsenic, phosphorous, antimony, or a combination thereof. The total density of the dopant within the absorber layer 160 can be controlled. Alternatively or additionally, the amount of the dopant can vary with distance from first surface 162 of absorber layer 160.

According to the embodiments provided herein, the p-n junction can be formed by providing absorber layer 160 sufficiently close to a portion of the photovoltaic device 100 having an excess of negative charge carriers, i.e., electrons or donors. In some embodiments, absorber layer 160 can be provided adjacent to n-type semiconductor material. Alternatively, one or more intervening layers can be provided between absorber layer 160 and n-type semiconductor material. In some embodiments, absorber layer 160 can be provided adjacent to buffer layer 150. For example, first surface 162 of the absorber layer 160 can be provided upon second surface 154 of buffer layer 150.

The photovoltaic device 100 can include a back contact layer 170 configured to mitigate undesired alteration of the dopant and to provide electrical contact to the absorber layer 160 to transport charge carriers generated therefrom. The back contact layer 170 can have a first surface 172 substantially facing first side 102 of photovoltaic device 100 and a second surface 174 substantially facing opposing side 104 of photovoltaic device 100. A thickness of back contact layer 170 can be defined between first surface 172 and second surface 174. The thickness of back contact layer 170 can be between about 5 nm to about 200 nm such as, for example, between about 10 nm to about 50 nm in one embodiment.

In some embodiments, back contact layer 170 can be provided adjacent to absorber layer 160. For example, the first surface 172 of back contact layer 170 can be provided upon the second surface 164 of absorber layer 160. In some embodiments, back contact layer 170 can include binary or ternary combinations of materials from groups I, II, VI, such as for example, one or more layers containing zinc, copper, cadmium and tellurium in various compositions. Further exemplary materials include, but are not limited to, zinc telluride doped with copper telluride, or zinc telluride alloyed with copper telluride. For ease of discussion, a stack of layers including buffer layer 150, absorber layer 160, back contact layer 170, or a combination thereof, may be referred to herein as a semiconductor stack 176.

The photovoltaic device 100 can include a first conducting layer 180 configured to provide electrical contact with the absorber layer 160 and/or back contact 170. The first conducting layer 180 can have a first surface 182 substantially facing the first side 102 of the photovoltaic device 100 and a second surface 184 substantially facing the opposing side 104 of the photovoltaic device 100. In some embodiments, first conducting layer 180 can be provided adjacent to back contact layer 170. For example, first surface 182 of first conducting layer 180 can be provided upon second surface 174 of back contact layer 170. A thickness of the first conducting layer 180 can be defined between first surface 182 and second surface 184. The thickness of first conducting layer 180 can be less than about 3 µm such as, for example, between about 50 nm to about 2.5 µm in one embodiment, or between about 100 nm to about 2 µm in another embodiment.

The first conducting layer 180 can include any suitable conducting material having a sheet resistance between 0.5 Ω/sq and 10 Ω/sq. Suitable examples include one or more layers of metal, one or one or more layers of nitrogen-containing metal, one or more conductive oxides, or any combination thereof. Alternatively or additionally, the first conducting layer 180 can be transparent or transparent to certain wavelengths of light. In some embodiments, the first conducting layer 180 can include a combination of layers conducting material. Each layer can contribute structural or electrical characteristics such that the stack of layers of conductive material have desired performance characteristics. Suitable metals include, but are not limited to, silver, nickel, copper, aluminum, titanium, palladium, chrome, molybdenum, gold, or combinations thereof. Suitable examples of a nitrogen-containing metals include, but are not limited to, aluminum nitride, nickel nitride, titanium nitride, tungsten nitride, selenium nitride, tantalum nitride, or vanadium nitride.

The photovoltaic device 100 can include a dielectric layer 190 configured to electrically isolate one or more layers of the photovoltaic device 100. For example, within a cell 200, dielectric layer 190 can electrically isolate first conducting layer 180 from a second conducting layer 210. The dielectric layer 190 can have a first surface 192 substantially facing the first side 102 of the photovoltaic device 100 and a second surface 194 substantially facing the opposing side 104 of the photovoltaic device 100. In some embodiments, the dielectric layer 190 can be provided adjacent to first conducting layer 180. For example, first surface 192 of dielectric layer 190 can be provided upon second surface 184 of first conducting layer 180. A thickness of the dielectric layer 190 can be defined between first surface 192 and second surface 194. The thickness of the dielectric layer 190 can be less than about 30 µm such as, for example, less than about 20 µm in one embodiment. Generally, the thickness of the dielectric layer 190 is at least one order of magnitude larger than the thickness of the first conducting layer 180 such as, for example, greater than about 25 times the thickness of the first conducting layer 180 in one embodiment.

The dielectric layer 190 can include a dielectric material such as, for example, a photoresist material or a non-conductive polymer. Suitable example dielectric material can further include epoxy, acrylic, phenolic, polyimide, or the like. In some embodiments, the dielectric material can have greater than about 10% transmissivity to wavelengths of light suitable for use for laser ablation, i.e., the wavelength range can be associated with solid state laser wavelengths. For example, the wavelength range can be between about 300 nm and about 1,100 nm.

Referring still to FIG. 2, photovoltaic device 100 can include a second conducting layer 210 configured to provide electrical contact with the TCO layer 140, the first conducting layer 180 of a neighboring cell 200, or both. The second conducting layer 210 can have a first surface 212 substantially facing the first side 102 of photovoltaic device 100 and a second surface 214 substantially facing the opposing side 104 of photovoltaic device 100. In some embodiments, the second conducting layer 210 can be provided adjacent to dielectric layer 190. For example, the first surface 212 of second conducting layer 210 can be provided upon the second surface 194 of dielectric layer 190. A thickness of the second conducting layer 210 can be defined between the first surface 212 and the second surface 214. The thickness of the second conducting layer 210 can be less than about 3 µm such as, for example, between about 50 nm to about 2.5 µm in one embodiment, or between about 100 nm to about 2 µm in another embodiment. The second conducting layer 210 can include any suitable conducting material having a sheet resistance between 0.5 Ω/sq and 10 Ω/sq. Suitable examples include one or more layers of metal, one or one or more layers of nitrogen-containing metal, or both, as described above with respect to the first conducting layer 180. Alternatively or additionally, the second conducting layer 190 can be transparent or transparent to certain wavelengths of light. In some embodiments, the second conducting layer 210 can have a different material composition than the first conducting layer 180. Alternatively or additionally, the first conducting layer 180, the second conducting layer 190, or both can include non-metal materials such as, for example, oxides.

The photovoltaic device 100 can include a back support 216 configured to cooperate with substrate 110 to form a housing for the photovoltaic device 100. The back support 216 can be disposed at the opposing side 104 of the photovoltaic device 100. For example, back support 216 can be formed over the second conducting layer 210. The back support 216 can include any suitable material, including, for example, glass (e.g., soda-lime glass).

Referring to FIG. 2, manufacturing of a photovoltaic device 100 generally includes sequentially disposing functional layers or layer precursors in a "stack" of layers through one or more thin film deposition processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). In some embodiments, VTD may be preferred for greater through put quality.

Manufacturing of photovoltaic devices 100 can further include the selective removal of the certain regions of the stack of layers, i.e., scribing or ablation, to divide the photovoltaic device into 100 a plurality of photovoltaic cells 200. For example, the serial scribes 202 can comprise a first isolation scribe referred to as a P1 scribe 222, and a second isolation scribe referred to as a P3 scribe 224. The P1 scribe 222 can be formed to ensure that the TCO layer 140 is electrically isolated between neighboring cells 200. Specifically, the P1 scribe 222 can be formed though the TCO layer 140, the buffer layer 150, and the absorber layer 160 of photovoltaic device 100. The P3 scribe 224 can be formed to isolate the conducting layer 180 into individual cells 200. The P3 scribe 224 can be formed through the second conducting layer 210. The P1 scribe 222, the P3 scribe 224, or both can be filled with a dielectric material. The dielectric material can be formed with a non-conducting material such as, but not limited to, the material of dielectric layer 190.

Referring collectively to FIGS. 1 and 2, a first conducting layer interconnect 226 can be formed to electrically connect layers of a photovoltaic cell 200. The conducting layer interconnect 226 can be configured to electrically connect the TCO layer 140 with the second conducting layer 210. As described herein, in some embodiments conducting layer interconnect 226 is formed using an alignment process as described below so as to isolate the interconnect 226 from first conducting layer 180 via the gap formed between these respective portions of the conductive layer. In some embodiments, interconnect 226 can be formed though and electrically isolated from some or all of the semiconductor stack 176. The interconnect 226 can be formed with a conducting material such as, but not limited to, the material of second conducting layer 210.

In some embodiments, the photovoltaic cell 200 can include a plurality of conducting layer interconnects 226 (a portion of which are schematically shown in FIG. 1) each configured to allow a desired amount of current to flow between the second conducting layer 210 and the TCO layer 140. For example, the number of conducting layer interconnects 226 in each cell 200 and the desired amount of current flowing through each of the conducting layer interconnects 226 can correspond to the current 205 to be generated by the group 206 of serially connected photovoltaic cells 200. Thus, the quantity of the conducting layer interconnects 226 can be scaled in accordance with the current 205 to be generated by the group 206 of photovoltaic cells 200.

Referring collectively to FIGS. 1 and 2, a second conducting layer interconnect 230 can be formed to electrically connect layers of the photovoltaic cell 200. The conducting layer interconnect 230 can be configured to electrically connect the first conducting layer 180 with the second conducting layer 210. Specifically, the conducting layer interconnect 230 can be configured to form selective points of electrical contact between the first conducting layer 180 and the second conducting layer 210, while the majority of the first conducting layer 180 and the second conducting layer 210 are electrically isolated by the dielectric layer 190. The conducting layer interconnect 230 can be formed from a conductive material having a sheet resistance between 0.5 Ω/sq and 10 Ω/sq. Suitable conductive materials are described above with respect to the first conducting layer 180. In some embodiments, the conducting layer interconnect 230 can comprise one or more dissimilar materials than the first conducting layer 180. For example, the conducting layer interconnect 230 can comprise a conductive material not present in the first conducting layer 180.

In some embodiments, the photovoltaic cell 200 can include a plurality of conducting layer interconnects 230 (a portion of which are schematically shown in FIG. 1) each configured to allow a desired amount of current to flow between the first conducting layer 180 and the second conducting layer 210. For example, as discussed above for conducting interconnects 226, the number of conducting layer interconnects 230 in each cell 200 and the desired amount of current flowing through each of the conducting layer interconnects 230 can correspond to the current 205 to be generated by the group 206 of serially connected photovoltaic cells 200.

Referring to FIG. 2, the dielectric layer 190 can be significantly thicker than the first conducting layer 180. The average thicknesses the dielectric layer 190 and the first conducting layer 180 can be determined at the cell 200 level.

Figure 4:
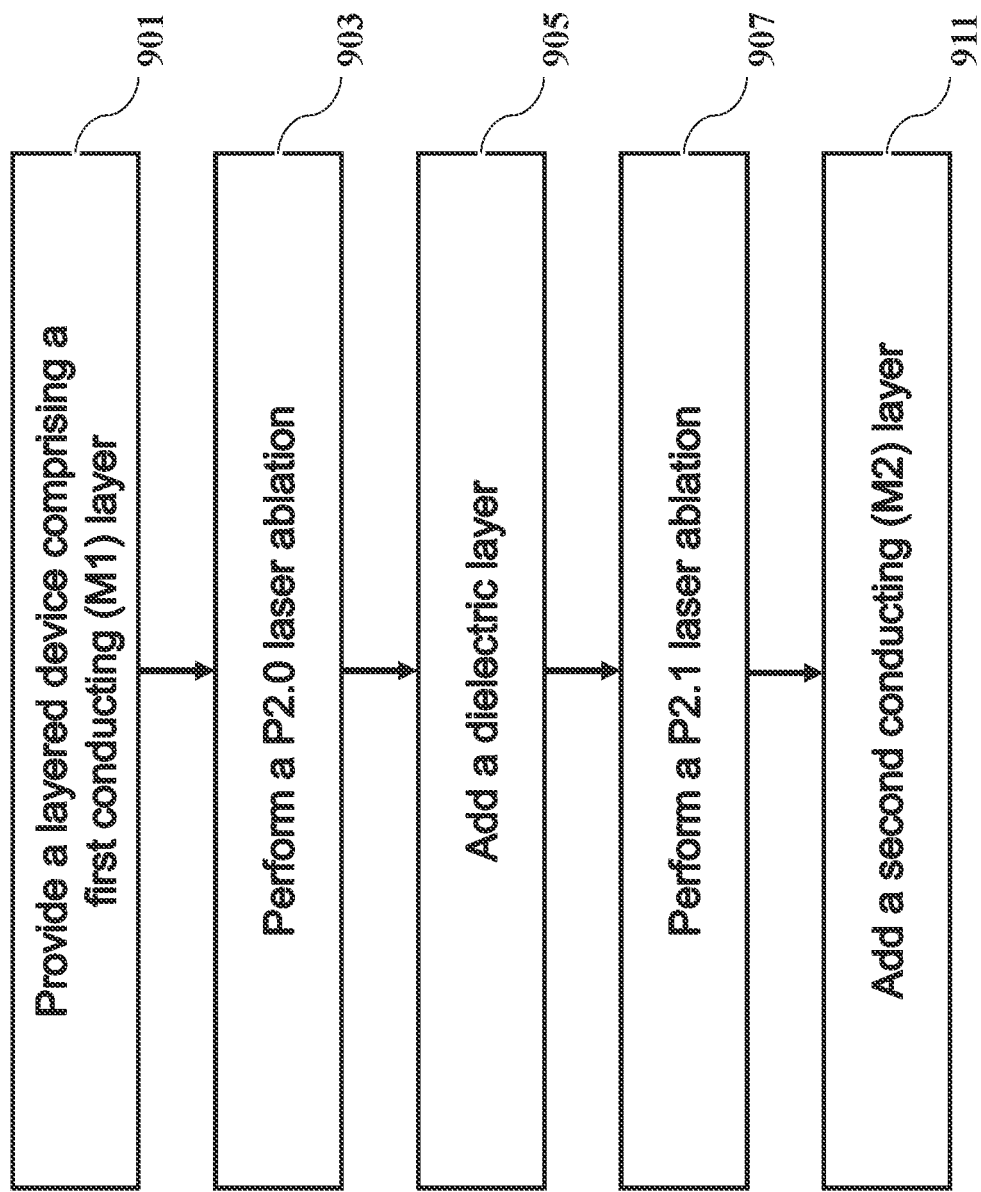
FIG. 4 is a flowchart depicting a process to produce conducting layer interconnects in a photovoltaic device using an alignment methodology according to one or more embodiments shown and described herein.
Figure 5:
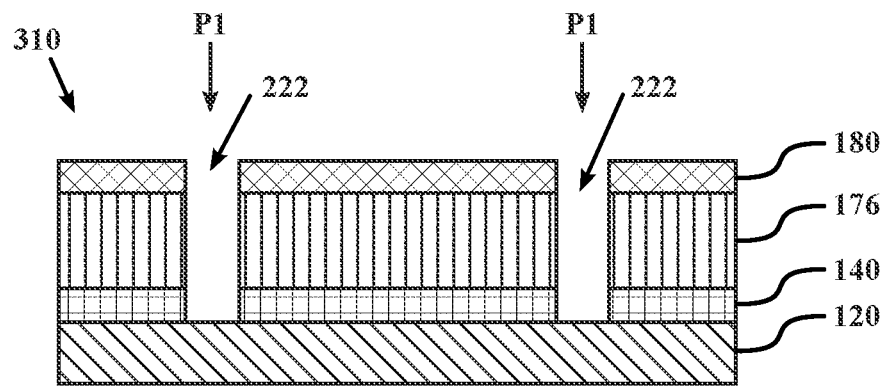
FIG. 5 schematically depicts a cross-sectional view of a layered device with a first conducting layer and a plurality of P1 scribes, according to one or more embodiments shown and described herein.

FIG. 4 is a flowchart depicting a process for producing the conducting layer interconnect 226 using an alignment process according to one or more embodiments described herein. FIG. 4 will be discussed in conjunction with FIGS. 5-9. FIG. 5 schematically depicts a cross-sectional view of a layered device having a first conducting layer and a plurality of P1 scribes 222. The process of FIG. 4 commences at block 901 where a layered device 310 (FIG. 5) is provided. The layered device 310 can include transparent layer 120, transparent conductive oxide (TCO) layer 140, semiconductor stack 176, and first conducting layer 180, also designated as M1 in some figures. One or more P1 scribes 222 can be formed through first conducting layer 180, absorber layer 160, and TCO layer 140.

Figure 6:
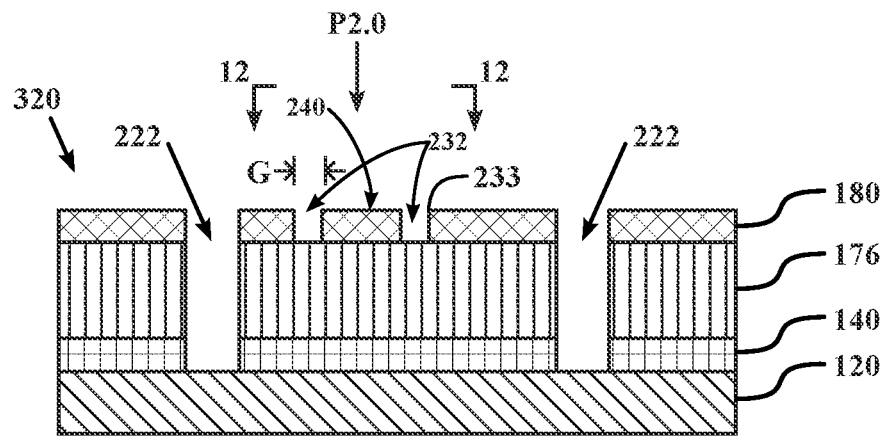
FIG. 6 schematically depicts the layered device of FIG. 5 after a P2.0 laser ablation process has been performed to produce a P2.0 scribe using an annular scribe ring, according to one or more embodiments shown and described herein.
Figure 13:
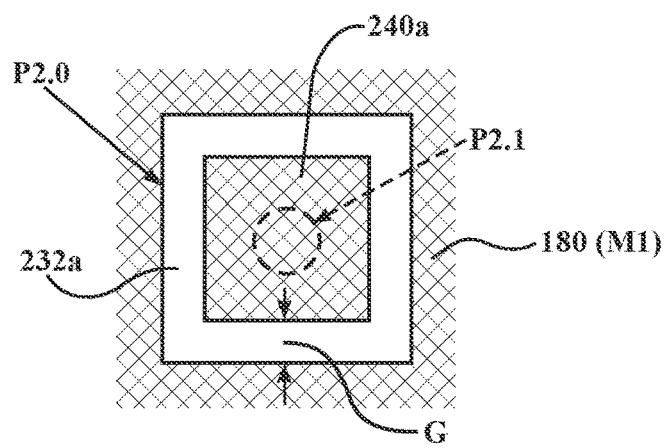
FIG. 13 is similar to FIG. 12, but schematically shows P2.0 as a square scribe in the conductive layer M1.

Next, at block 903 of FIG. 4, a P2.0 laser ablation process is performed on the layered device 310 (FIG. 5) to produce a P2.0 scribe 232 through first conducting layer 180 (M1). Generally, the P2.0 scribe 232 can be considered substantially tubular, i.e., a tubular shaped section can be removed from the first conducting layer 180. For example, as will be discussed, from a top view perspective the annular scribe ring 800 (FIG. 10) or 900 (FIG. 11) may be used to form the P2.0 scribe 232 having an annular ring shape. While some embodiments of the P2.0 scribe 232 are formed herein by an annular scribe ring, other shapes are contemplated. For example, the P2.0 scribe 232 may be any closed ended regular shape or repeatable shape, one example of which is shown in FIG. 13 as a square scribe 232a. Also, while some embodiments of the P2.0 scribe 232 are formed at a given gap width G (FIG. 6), any gap width is contemplated that results in an effective scribe (as described in more detail below). See for example P2.0 scribe 232a in FIG. 14. FIG. 6 schematically depicts a layered device 320 which represents the layered device 310 of FIG. 5 after the P2.0 laser ablation process of block 903 (FIG. 4) has been performed. Laser ablation of first conducting layer 180 (FIG. 6) is performed down to the semiconductor stack 176, to produce a P2.0 scribe 232.

The P2.0 scribe 232 can be produced using the annular scribe ring 800 or 900 (FIG. 10 or FIG. 11, respectively) to define a conductive island 240 (FIG. 6) which remains in first conducting layer 180 (M1). Accordingly, the conductive island 240 is formed from the same material as the first conducting layer 180 (M1). The conductive island 240 of first conducting layer 180 (M1) can be any regularly or geometrically shaped protuberance projecting away from the semiconductor stack 176. Conductive island 240 can be formed by selective removal of first conducting layer 180 (M1). Generally, the amount of material removed (defined by a gap G in FIGS. 6 and 12) is such to provide sufficient electrical isolation between the conductive island 240 and the remainder of the first conducting layer 180 (M1). For example, the gap G can be in the range 10 to 50 microns, and preferably 15 to 25 microns.

Note that because conductive island 240 remains after this scribing operation, the volume of material ablated from first conducting layer 180 (M1) is less than what would have been required to completely remove all of first conducting layer 180 (M1) within the outer wall 233 of the P2.0 scribe. In other words, the volume of material ablated within an annular scribe ring of a given diameter is much less than the volume of material that would need to be ablated from within a circle having the same overall diameter as the annular scribe ring. The lower volume of material ablated serves to reduce the pulse energy of the laser required for the ablation process. For example, the Joules per second requirement of the laser can be relaxed and, in some embodiments, reduced by over 50%. According to some embodiments, the J/sec requirement is in the range of 20 J/sec to 200 J/sec. According to other embodiments, the J/sec requirement is in the range of 30 J/sec to 130 J/sec. This factor increases the available options for laser systems, and also improves overall throughput.

Figure 7:
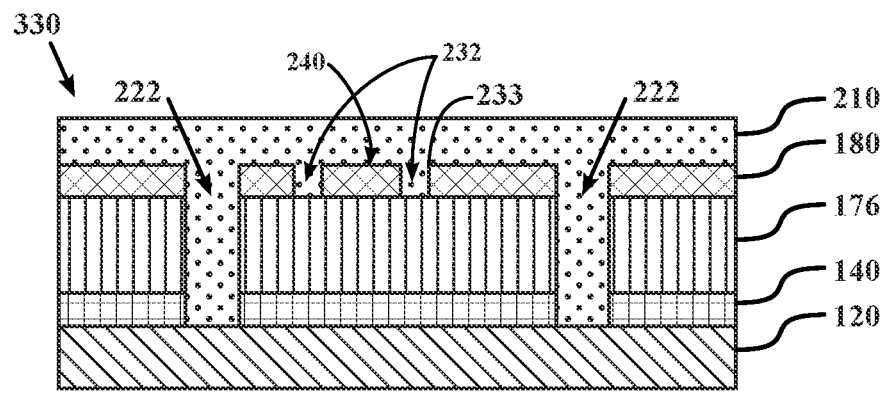
FIG. 7 schematically depicts the layered device of FIG. 6 after a dielectric layer is added to fill in the P1 and P2.0 scribes, according to one or more embodiments shown and described herein.

The process of FIG. 4 advances to block 905 where a dielectric layer is added to the layered device 320 of FIG. 6 to produce a layered device 330 as shown in FIG. 7. The layered device 330 (FIG. 7) includes a dielectric layer 210 which has been added to fill in the P1 scribes 222 and the P2.0 scribe 232.

Then, at block 907, the process of FIG. 4 performs a P2.1 laser ablation to produce a P2.1 scribe, using the ring shape of the P2.0 scribe as an alignment fiducial for the P2.1 ablation. Accordingly, for ablation systems that require alignment fiducials, as described in more detail below P2.0 scribe 232 may be of sufficient size for an ablation tool alignment system to detect and use as an alignment fiducial.

Figure 12:
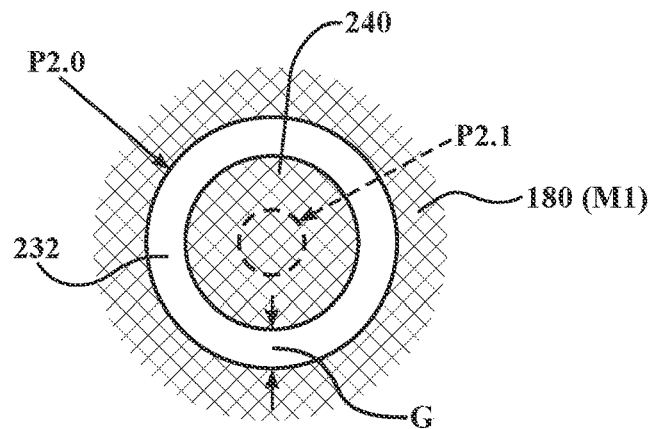
FIG. 12 is plan view taken from the line 12-12 of FIG. 6, and schematically shows P2.0 as an annular scribe in the conductive layer M1.
Figure 14:
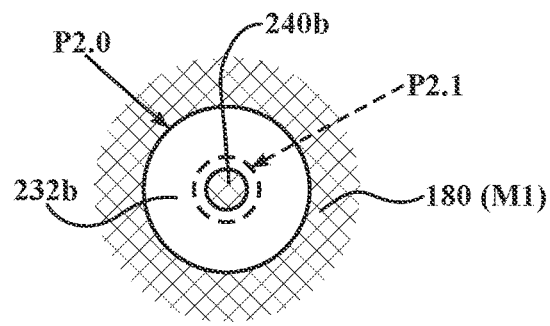
FIG. 14 is similar to FIG. 12, but shows an embodiment wherein the inner diameter of a first annular scribe P2.0 is less that the outer diameter of a second scribe P2.1, thus ablating substantially the entire conductive island formed by the scribe P2.0.

FIGS. 12-14 present three different embodiments of the geometry of scribe 232, conductive island 240, and targeted area for scribe P2.1. All depictions are plan views of surface 184 of first conducing layer 180, taken from the surface portion 12-12 of FIG. 6.

In FIG. 12, scribe P2.0 results in an annular scribe 232 having a width (or gap) G, that defines a corresponding concentric, circular conductive island 240. While conductive island 240 is referred to as "circular," in some embodiments it may be cylindrical, as it has the same thickness of first conducting layer 180. The area to be targeted for a subsequent scribe P2.1 is shown as a hatched, circular area that is smaller than (and concentric with) circular conductive island 240. It is to be understood that the gap G can be tuned as a function of parameters of the scribe operation, as described in more detail below. Moreover, while the diameter of the target area for scribe P2.1 is shown as being approximately one-third the diameter of circular conductive island 240, in practice the difference in diameter can be any differential, so long as the diameter of the P2.1 scribe is less than the diameter of the P2.0 scribe, resulting in an opening completely within circular conductive island 240. In other words, in an embodiment as shown in FIG. 12, outer portions of circular conductive island 232 remain after scribe P2.1. This is illustrated in FIG. 8 as remaining portions 242 of conductive island 240.

In FIG. 13, scribe P2.0 results in a square scribe 232a having a width (or gap) G, that defines a corresponding concentric, square conductive island 240a. The area to be targeted for a subsequent scribe P2.1 is shown as a hatched, circular area that is smaller than (and concentric with) square conductive island 240. Again, while the width of the target area for scribe P2.1 is shown as being approximately one-third the width of square conductive island 240, in practice this differential can vary so long as the width of the P2.1 scribe is less than the width of the P2.0 scribe, resulting in an opening completely within square conductive island 240. Similarly to the embodiment depicted in FIG. 12, in an embodiment as shown in FIG. 13 outer portions of square conductive island 232a remain after performing scribe P2.1.

FIG. 14 is similar to FIG. 12, in that scribe P2.0 results in an annular scribe 232b that defines a corresponding concentric, circular conductive island 240b. However, unlike the embodiments shown in FIGS. 12 and 13, in this embodiment the area to be targeted for a subsequent scribe P2.1 is shown as a hatched, circular area that is larger than (and concentric with) circular conductive island 240. While the diameter of the target area for scribe P2.1 is shown as being slightly larger than the diameter of circular conductive island 240b, in practice the difference in diameter can be any differential, so long as the P2.1 scribe results in an opening completely outside circular conductive island 240b. In other words, in an embodiment as shown in FIG. 14, circular conductive island 232 is substantially ablated during scribe P2.1, such that (in a cross section otherwise the same as shown in FIG. 8) there would be no remaining portions 242 of conductive island 240 after scribe P2.1.

Figure 8:
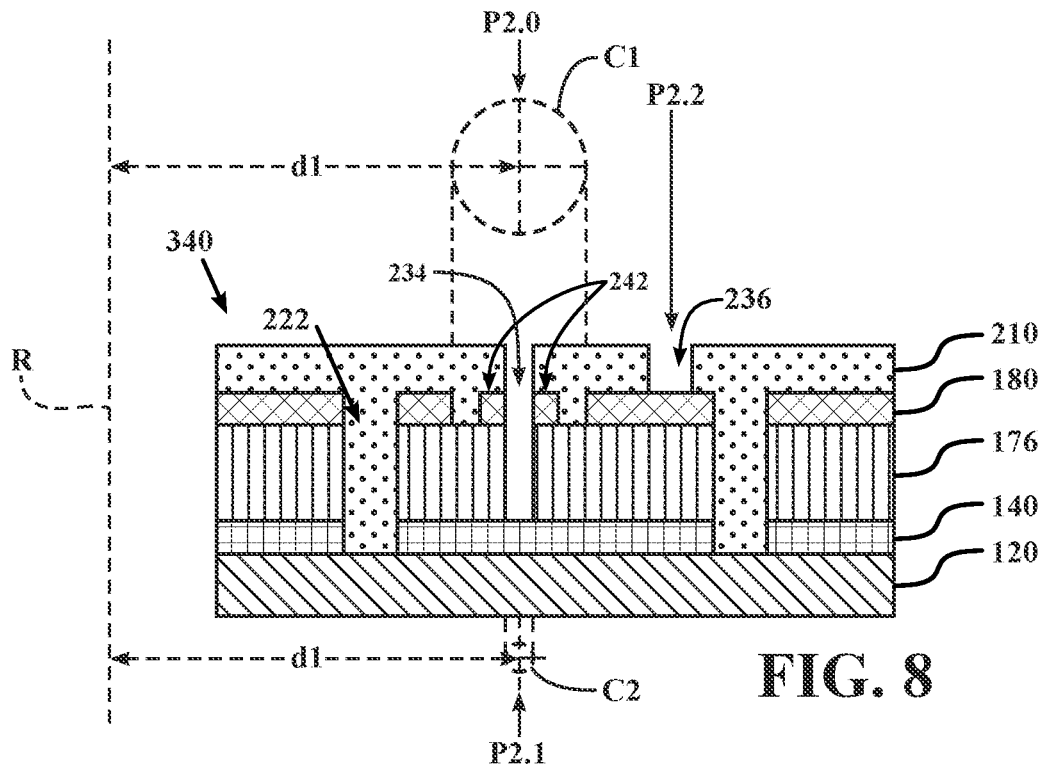
FIG. 8 schematically depicts the layered device of FIG. 7 after a P2.1 laser ablation process has been performed to produce a P2.1 scribe, according to one or more embodiments shown and described herein.

FIG. 8 schematically depicts a layered device 340 which represents the layered device 330 of FIG. 7 after the P2.1 laser ablation process steps 907 (FIG. 4) have been performed, in accordance with embodiments such as those shown in FIGS. 12 and 13. Referring to FIG. 8, the P2.1 laser ablation is preferably ablated from the glass side, by passing the laser through the glass 120 and TCO layer 140 (at a laser frequency that does not cause ablation of these layers), and then into the semiconductor stack 176, the first conducting layer 180 (M1) and the dielectric 210, to ablate these layers and produce the P2.1 scribe 234. Alternatively, the P2.1 ablation may be performed from the dielectric side.

The laser scribing operation discussed above locates alignment fiducials by use of projected markers (essentially, by running predictive software that will predict, or "project," where fiducials will be located along the scanned workpiece surface). The projected marker for the P2.0 scribe 232 is indicated as a projected circle C1. Once projected circle C1 is correlated to the detected scribe 232, the alignment system then determines the location of scribe 234 by correlating projected circle C1 to a reference mark R, via one or more dimensional lengths represented by the single line dl. The projected circle C2 for the P2.1 scribe can then be determined using the reference mark R and similar dimensional length dl. Accordingly, the P2.1 scribe 234 is produced using the ring shape of the P2.0 scribe 232 as an alignment fiducial for the ablation P2.1.

Figure 15:
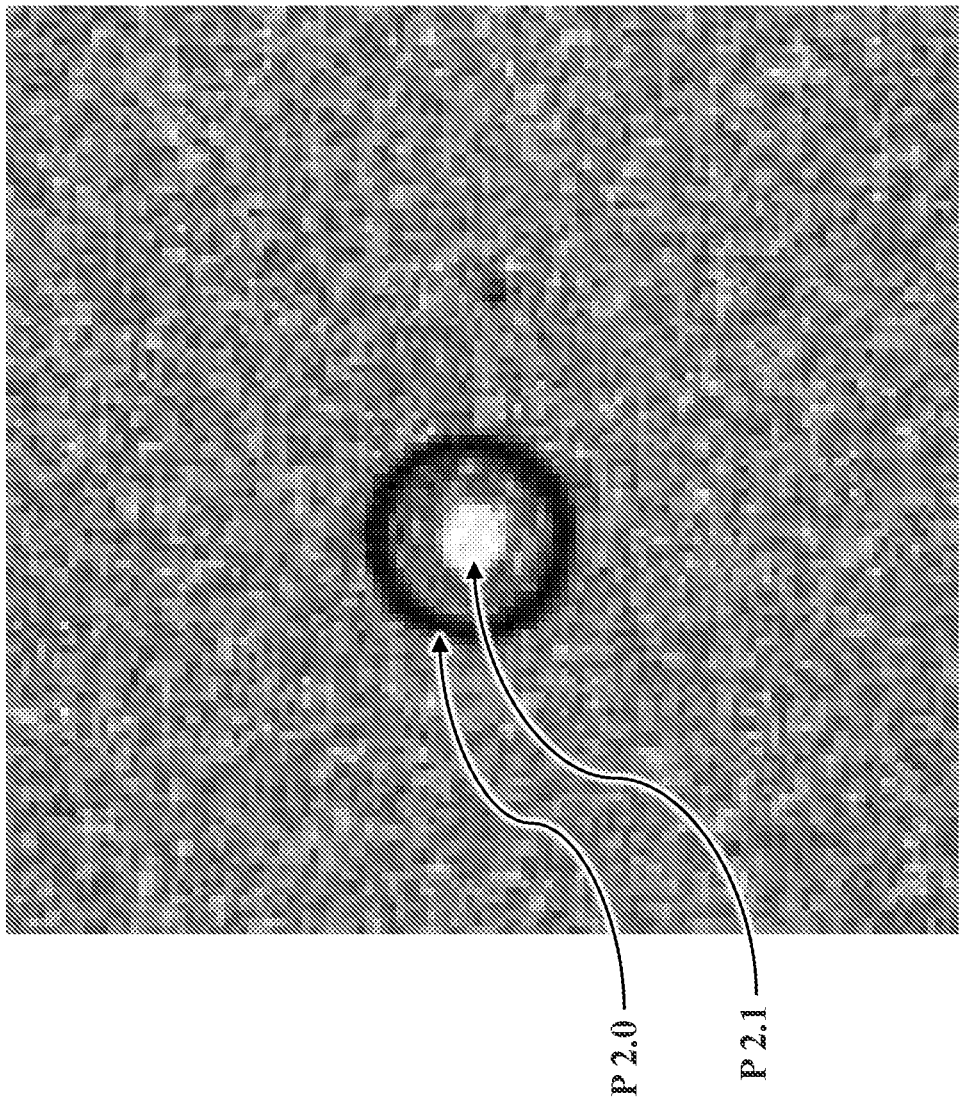
FIG. 15 is a pictorial representation, similar to FIG. 12, and showing the P2.1 ablation within the P2.0 scribe.

FIG. 15 is a pictorial representation, similar to FIG. 12, and showing the P2.1 ablation within the P2.0 scribe. The ring or closed surface of the P2.0 scribe allows for easy detection of the donut ring after the P2.1 ablation is done because there is a contrast between scribe P2.0 and the interior conductive island, as shown in FIG. 15. Whereas, if there was just a full ablated circle with no interior conductive island, there would be no contrast presented.

Additionally, in some embodiments, a scribe is performed down to the first conductive layer 180 (FIG. 8) to produce a P2.2 scribe 236. This P2.2 scribe may also be referenced to the P2.0 scribe via the reference mark R and dimensional lengths different from dl, in a manner similar to how the P2.1 scribe was referenced to the P2.0 scribe as described above with reference to FIG. 8.

Figure 9:
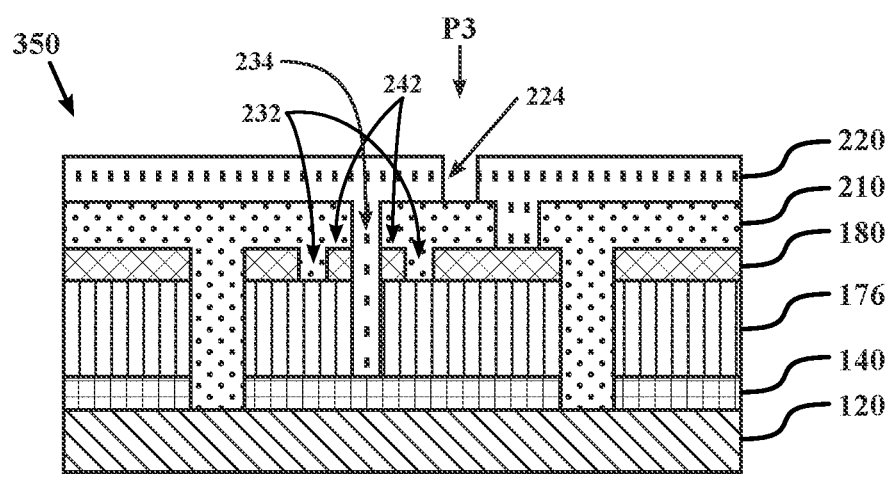
FIG. 9 schematically depicts the layered device of FIG. 9 after adding a second conducting (M2) layer to the stack, according to one or more embodiments shown and described herein.

With reference to FIG. 4, at block 911 a second conducting layer 220 (M2) is added to the layered device 340 of FIG. 8 to produce a layered device 350 as shown in FIG. 9, to form the conducting layer interconnect 226. The layered device 350 (FIG. 10) includes the P2.0 scribes 232, the P2.1 scribe 234, and a new P3 scribe 224 (which may also be located via the reference mark R and dimensional lengths different from dl, in a manner similar to how the P2.1 scribe was referenced to the P2.0 scribe as described above with reference to FIG. 8). As illustrated in FIG. 9, a portion of second conducting layer 220 disposed within P2.1 scribe 234 forms a cylindrically shaped interconnect to layer 140. That portion of second conductive layer 220 is disposed substantially within, and extends through, circular conductive island 240 (depicted in FIG. 9 as remaining portions 242 of circular conductive island 240), and extends through both dielectric layer 210 and semiconductor stack 176 to TCO 140. As such, the cylindrical shaped interconnect is disposed laterally substantially within the conductive island, is disposed substantially vertically through the conductive island and dielectric layer 220 to the TCO 140, and has a diameter that is less than the diameter of circular conductive island 240. As previously described, circular conductive island 240 may be cylindrical in shape, due to the thickness of first conductive layer 180 from which conductive island 240 was formed. In such embodiments, the length of cylindrical conductive island 240 is less than the length of the cylindrical shaped interconnect.

Figure 10:
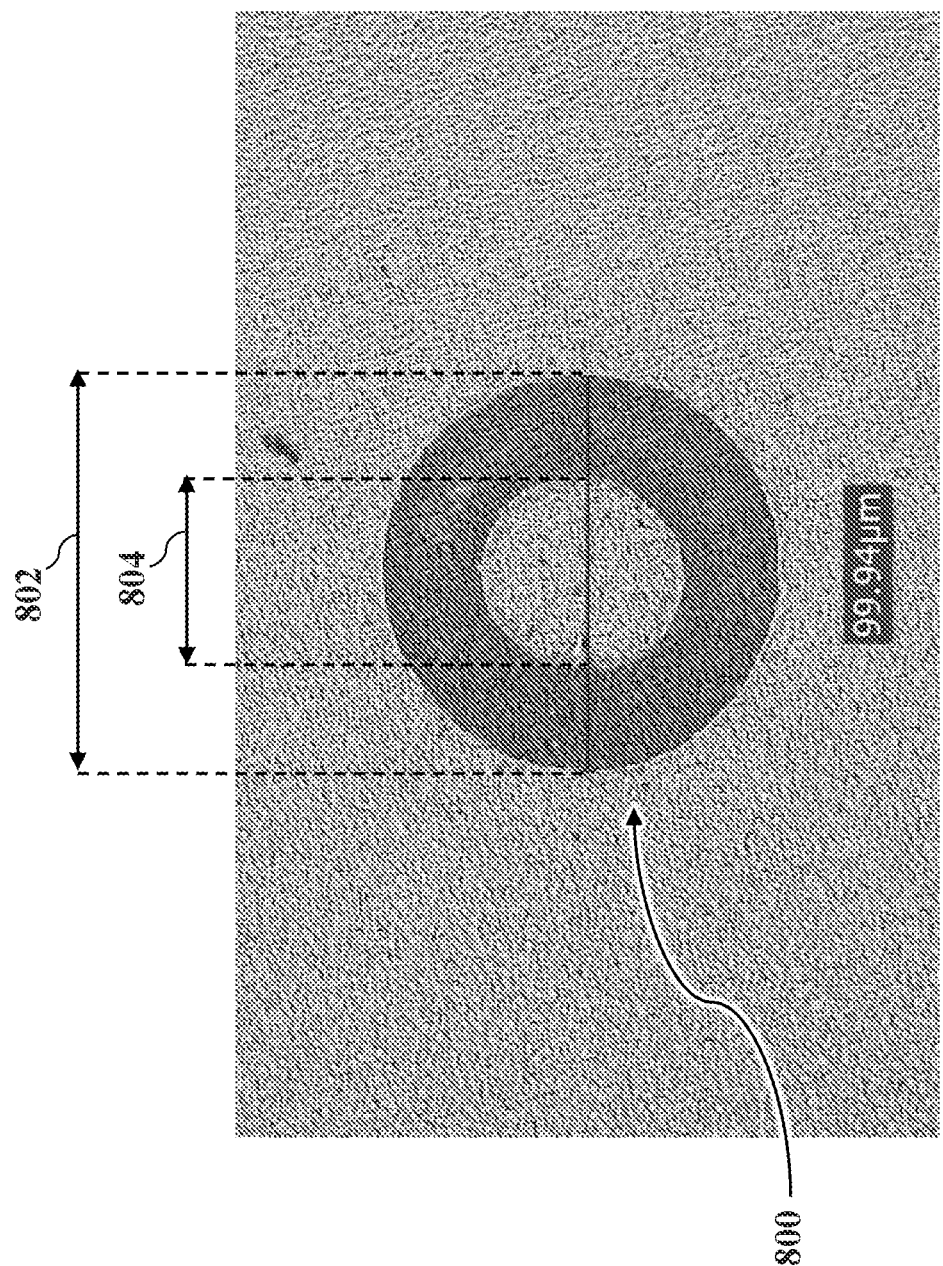
FIG. 10 is a pictorial representation of one embodiment of an annular scribe ring for producing the P2.0 laser ablation scribe, using a first distance between a focal lens and a diffractive axicon.
Figure 11:
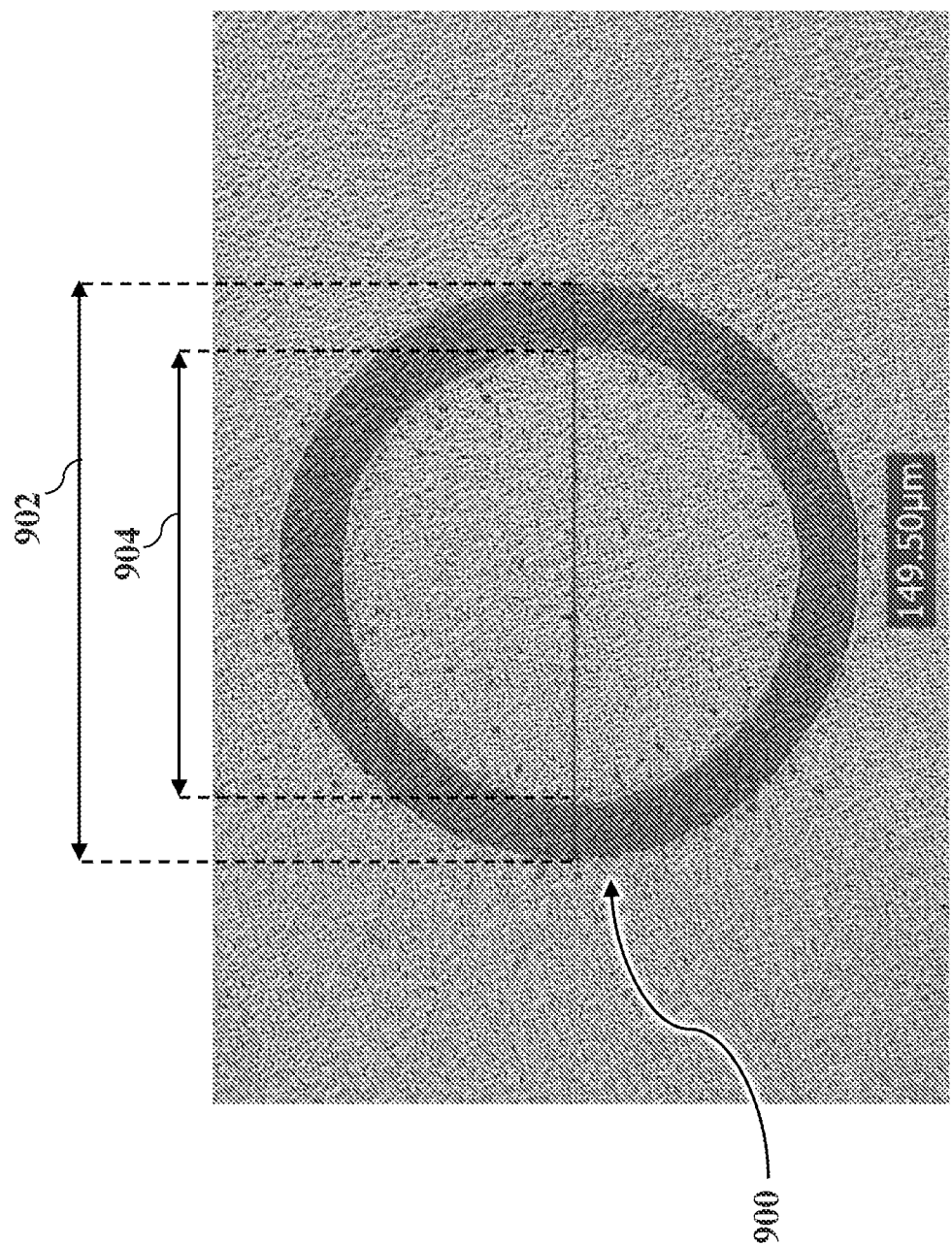
FIG. 11 is a pictorial representation of another embodiment of an annular scribe ring for producing the P2.0 laser ablation scribe, using a second distance between a focal lens and a diffractive axicon, where the second distance is greater than the first distance.

According to some embodiments, the shape of the P2.0 ablation is in the form of an annular (ring-shaped) beam. A cross-section of the beam is defined as an area between a first concentric ring and a second concentric ring, where the first concentric ring has a larger diameter than the second concentric ring, and the first and second concentric rings are each substantially circular in shape. FIG. 10 is a pictorial representation of an annular scribe ring 800 produced using a first distance between a focal lens and a diffractive axicon (DA). Likewise, FIG. 11 is a pictorial representation of an annular scribe ring 900 produced using a second distance between a focal lens and the DA, where the second distance is greater than the first distance.

The diffractive axicon includes a first axicon lens with a sharp tip, a second axicon lens with a sharp tip, and a focusing lens that focuses an incident beam at a focal plane. By "sharp tip," we refer to the emitting lens surfaces forming an acute angle at the center of the lens, as opposed to the center of the lens being rounded. The specific angle of the emitting lens surfaces varies (as a function of, for example, lens size, composition, number of emitting surfaces, and polish), and can be any angle that results in generating the imaging described herein. In another embodiment, instead of two axicon lenses, a single binary diffractive axicon lens may be utilized. In yet another embodiment, a single axicon lens may be utilized. The DA is used to generate a Bessel profile, which in turn becomes a ring at the focal plane. In general, the DA fits in a lens tube, and is easy to auto-align with the use of retaining rings. In an alternate embodiment DA alignment does not require the use of retaining rings. The beam focuses to a ring, meaning that the highest fluence occurs when the beam has an annular profile.

Through the use of a laser optic which creates an annular (ring-shaped) beam profile at focus, one can overcome or circumvent many of the issues that arise when attempting to defocus a Gaussian laser beam. The annular scribe rings 800, 900 of FIGS. 10 and 11, respectively, may be generated using an appropriate axicon (axially-symmetric conical) optic of the diffractive type, in conjunction with a normal plano-convex focal lens.

The annular scribe ring 800 (FIG. 10) has an outer diameter 802 and an inner diameter 804. Likewise, the annular scribe ring 900 (FIG. 11) has an outer diameter 902 and an inner diameter 904. The inner and outer diameters 804, 904 and 802, 902, respectively, of the annular scribe rings 800, 900 may be adjusted by placing the DA after the focal lens, and then varying the distance L of the DA from the focal lens. The inner and outer diameters 804, 904 and 802, 902, decrease in a substantially linear manner as a function of increasing distance between the DA and the focal lens. The thickness of the annular scribe ring 800, 900 can be defined as the difference between one-half of the outer diameter (802 or 902) and one-half of the inner diameter (804 or 904), where one-half of the outer diameter comprises an outer radius and one-half of the inner diameter comprises an inner radius. The thickness of each scribe may be adjusted by varying the input beam diameter. A larger input beam results in a thinner ring, and vice versa. In some embodiments, the outer diameter 802, 902 is greater than or equal to 110 µm. In other embodiments, the outer diameter 802, 902 is in the range of 100 µm to 250 µm.

Unexpectedly, the inventors also found that the thickness of the annular scribe ring 800, 900 varies as a function of the distance L of the DA from the focal lens. As the distance L increases, while the overall ring diameter decreases, ring thickness increases. Pursuant to one set of illustrative examples, when L is 8 mm, ring thickness is approximately 17 mm. This annular ring is illustrated in FIG. 15. As L increases to 35 mm, ring thickness is approximately 20 mm. As illustrated in FIG. 11, with L set to 62 mm, ring thickness (902-to-904) is approximately 26 mm, and ring diameter is approximately 150 um, when ablated at a pulse energy of 400 and duration of 28 ns. Then, as shown in FIG. 10, when L is increased to 86 mm, ring thickness (802-to-804) increases to 35 mm, and ring diameter is approximately 100 um, when ablated at a pulse energy of 450 and duration of 28 ns. The relationship between ring thickness and L may also be affected by collimation and/or alignment. Also, the beam may be focused to a smaller area so that the outer edges of the Gaussian have more fluence.

Each of the two concentric rings defining the annular scribe ring 800, 900 (FIGS. 10 and 11) is substantially circularly shaped, thereby providing an annular beam profile. In some embodiments, the annular beam profile may be a perfect or near-perfect circle. In other embodiments, the annular beam profile may be in the shape of concentric ovals, concentric rectangles, concentric squares, or concentric polygons. In some embodiments, a peripheral thickness of the annular beam profile, at a point of intersection with the surface of the layered device, is in a range of 10 µm to 50 µm. In some embodiments, the peripheral thickness is 10-30% of the outer diameter or an outer maximum width of the annular beam profile, at a point of intersection with the layered device 350 (FIG. 9).

The pulse energy used to generate the annular scribe rings 800, 900 of FIGS. 10 and 11, respectively, is significantly decreased from a "full circle" ablation (i.e., no conductive island) due to the total ablated area being smaller (>50% decrease in this application, due to the annular shape), relative to ablating the entire diameter of a circular area. Pursuant to one illustrative example, to make a ~150 µm P2.0 circular ablation using a defocused Gaussian beam, approximately 1500 of pulse energy is used. Using the same laser but with the diffractive axicon (DA) installed to make an annular ring instead of a circle, approximately 30 µJ to 40 µJ is used, or up to approximately 50 µJ in other examples. Pursuant to other illustrative examples, approximately 80 µJ to 130 µJ is used, with a pulse repetition rate of 500 to 3000 Hz, and a distance L of the DA from the focal lens of 5 mm to 10 mm.

Pursuant to other illustrative examples (including those illustrated in FIGS. 10 and 11), the distance L of the DA from the focal lens can be set to a value in the range of 1 mm to 200 mm, or in the range of 5 mm to 100 mm, or in the range of 8 mm to 50 mm. In some embodiments, depth of field (DoF) is in the range of plus or minus 900 µm. In other embodiments, DoF is in the range of plus or minus 600 µm. In still other embodiments, DoF is in the range of plus or minus 400 µm.

In embodiments where the generated laser beam generates an ablation in the shape of an annular scribe ring 800, 900 (FIGS. 10 and 11, respectively), or otherwise generates a regular (that is, perfect or near-perfect) closed shape (such as a circle) P2.0 ablation, this feature significantly enhances the ability of computer pattern recognition software to find the center of the annular scribe ring. A similar approach can be adopted for beams that are shaped in the form of other regular, closed shaped ablations such as ovals, rectangles, squares, or polygons. The ability to use pattern recognition software makes meeting the accuracy requirement of ±20 um for the placement of P2.1 ablations facile and reliable, as the shape being referenced has a substantially exact, easily-defined center. However, in other embodiments, the annular beam pattern can be used as a fiducial for alignment of any other feature, in addition to or in lieu of performing a P2.1 ablation.

Through the use of the annular scribe ring 800, 900 as illustrated in FIGS. 10 and 11, the accuracy and repeatability of scribes placed over device substrates is improved. More specifically, the ability to generate a perfectly (or near-perfectly) circular P2.0 ablation is facilitates hitting the same region on the substrate twice with a laser beam, within an accuracy of ±20 µm over a 2.4 $m^2$ area, because the beam has a shape with an exact center. According to another embodiment, the accuracy is within the range of ±50 µm over a 2.4 $m^2$ area. According to yet another embodiment, the accuracy is within the range of ±20 µm over a 1.0 $m^2$ area. According to still another embodiment, the accuracy is within the range of ±20 µm over a 5.0 $m^2$ area. According to some embodiments, the process begins with a P2.0 ablation being performed. As previously discussed with reference to FIG. 8, before the P2.1 ablation is made, the position of the center of the P2.0 ablation is referenced using, for example, pattern recognition. This position information is used to accurately place P2.1 ablation entirely within the bounds of the P2.0 ablation. Furthermore, the significant decrease in required pulse energy may improve the processing time required for the P2.0 ablation by allowing higher laser repetition rates to be used. For example, required pulse energy may decrease by 50% or more.

In some embodiments, by the use of annular scribe rings 800, 900 (FIGS. 10 and 11) that better optimize P2.0-to-P2.1 alignment over a wider area of the photovoltaic module, interconnect current collection efficiency is enhanced, resulting in higher module wattages. This approach further opens pathways to realizing manufacturing techniques and precision engineering of photovoltaic cells that would otherwise be limited due to the scribe alignment tolerances required for scale-up. According to some embodiments, the approach of using annular scribe rings may be applied to any thin film device or printed circuit board (PCB) fabrication process.

According to some embodiments, the layered device 350 is used to provide a photovoltaic device. The layered device 350 includes the semiconductor stack 176. The semiconductor stack 176 is formed over a first electrical contact, such as the TCO layer 140. The first conductive layer 180 (M1) is formed over the semiconductor stack 176. The conductive island 240 is formed in the first conductive layer 180 (M1) over the semiconductor stack 176. An interconnect 226 is formed through the conductive island 240, where the conductive island 240 and the interconnect are isolated from the first conductive layer 180 (M1) at the conductive island 240. The interconnect forms an electrical connection with the first contact (such as the TCO layer 140).

According to a further set of embodiments, a portion of the conductive island 240 is ablated, leaving behind the remaining portion of conductive island 242. An interconnect is formed through the remaining portion of conductive island 242, where the remaining portion of conductive island 242 and the interconnect are isolated from the first conductive layer 180 (M1) at the remaining portion of conductive island 242. The interconnect forms an electrical connection with the first contact (such as the TCO layer 140).

According to some embodiments, a photovoltaic device is provided that has a semiconductor stack over a first contact, a conductive island formed in a first conductive layer over the semiconductor stack, and an interconnect formed through the conductive island, wherein the conductive island and the interconnect are isolated from the first conductive layer at the conductive island, and the interconnect forms an electrical connection with the first contact.

According to some embodiments, a conductive device is provided that has a plurality of layers on a substrate, including at least one conductive layer and at least one dielectric layer on the conductive layer, a regular closed shaped island on the dielectric layer, and a cylindrical shaped interconnect disposed laterally substantially within the island and disposed substantially vertically through the island and the dielectric layer to the conductive layer. According to some embodiments, the regular island is cylindrical, the vertical length of the cylindrical conductive island being less than the vertical length of the cylindrical shaped interconnect.

According to some embodiments, a method for forming a conductive interconnection is provided. The method includes forming a semiconductor stack 176 (FIGS. 2 and 5) over a first contact. A first conductive layer 180 (M1) is formed over the semiconductor stack 176. A shaped region of the first conductive layer 180 (M1) is ablated from the semiconductor stack 176, wherein a conductive island 240 (FIG. 6) is formed from the first conductive layer 180 (M1) and demarcated by the shaped region (for example, the shape produced by the annular scribe ring 800, 900 of FIGS. 10 and 11, respectively). A dielectric layer 210 (FIG. 7) is formed over the first conductive layer 180 (M1), wherein the dielectric layer at least partially fills the shaped region. A passage (P2.1 scribe 234, FIG. 8) is formed through the circular conductive island 240 of the first conducting layer 180 (M1), leaving behind the remaining portion of conductive island 242 (FIG. 8). The passage extends through the dielectric layer 210, the remaining portion of conductive island 242, and the semiconductor stack 176. The passage is at least partially filled with an interconnect that forms an electrical connection with the first contact (TCO layer 140).

According to the embodiments provided herein, a photovoltaic device includes a semiconductor stack formed over a first electrical contact. A first conductive layer is formed over the semiconductor stack. A conductive island is formed in the first conductive layer over the semiconductor stack. An interconnect is formed through the conductive island, where the conductive island and the interconnect are isolated from the first conductive layer at the conductive island. The interconnect forms an electrical connection with the first contact. According to some embodiments, the conductive island is produced using an annular scribe.

According to a further set of embodiments, a portion of the conductive island is ablated, leaving behind a remaining portion of the island. An interconnect is formed through the remaining portion of the island, where the remaining portion of the island and the interconnect are isolated from the first conductive layer at the remaining portion of the island. The interconnect forms an electrical connection with the first contact.

According to some embodiments, a method for forming a conductive interconnection is provided. The method includes forming a semiconductor stack 176 over a first contact. A first conductive layer is formed over the semiconductor stack. A shaped region of the first conductive layer is ablated from the semiconductor stack, wherein a conductive island is formed from the first conductive layer and demarcated by the shaped region (for example, the shaped region may be produced by an annular scribe ring). A dielectric layer 210 is formed over the first conductive layer, wherein the dielectric layer at least partially fills the shaped region. A passage is formed through the conductive island of the first conductive layer, leaving behind the remaining portion of the island. The passage extends through the dielectric layer, the remaining portion of conductive island 242, and the semiconductor stack. The passage is at least partially filled with an interconnect that forms an electrical connection with the first contact.

According to some embodiments, a method for forming a photovoltaic device is provided. A layered device is provided comprising a transparent layer, a transparent conductive oxide layer, a semiconductor stack, and a first conducting layer. A P2.0 laser ablation is performed on the first conducting layer down to the semiconductor stack to produce a P2.0 scribe using an annular scribe ring to define a conductive island in the first conducting layer. A dielectric layer is added to the layered device by at least partially filling the P2.0 scribe with dielectric material. A P2.1 laser ablation is performed on the dielectric layer, the island, and the semiconductor stack to produce a P2.1 scribe within the P2.0 scribe.

According to some embodiments, a device is provided that has a substrate having at least one conductive layer and at least one dielectric layer disposed thereon, one of the conductive and dielectric layers being over the substrate to form an intermediate layer, and the other one of the conductive and dielectric layers being over the intermediate layer to form an upper layer, and an alignment fiducial island on the upper layer, the alignment fiducial having a regular closed shape. In some embodiments, the island has a shape selected from the group consisting of circles, ovals, rectangles, squares, and polygons.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for forming a conductive interconnection comprising:
   forming a semiconductor stack over a first contact;
   forming a first conductive layer over the semiconductor stack; and
   ablating a shaped region of the first conductive layer from the semiconductor stack, wherein a conductive island is formed from the first conductive layer and demarcated by the shaped region;

forming a dielectric layer over the first conductive layer;

forming a passage through the conductive island of the first conductive layer, the passage extending through the dielectric layer, the conductive island of the first conductive layer, and the semiconductor stack; and filling the passage, at least partially, with an interconnect that forms an electrical connection with the first contact.

2. The method of claim 1, further comprising forming the passage such that a portion of the conductive island remains after the passage forming step.

3. The method of claim 1, further comprising forming the passage such that the entire conductive island is removed by the passage forming step.

4. The method of claim 1, further comprising forming the dielectric layer to partially fill the shaped region.

5. The method of claim 1, further comprising forming a second conductive layer adjoining the dielectric layer.

6. The method of claim 5, wherein the second conductive layer forms at least a portion of the interconnect.

7. The method of claim 1, further comprising performing the ablating in the shape of an annular scribe ring to thereby separate and electrically isolate the conductive island from the first conductive layer.

8. The method of claim 7, wherein the annular scribe ring is produced using a focal lens and a diffractive axicon.

* * * * *